(12) United States Patent
Tanaka et al.

(10) Patent No.: US 9,832,909 B2
(45) Date of Patent: Nov. 28, 2017

(54) ELECTRONIC EQUIPMENT COOLING DEVICE AND POWER CONVERTER HAVING ELECTRONIC EQUIPMENT COOLING DEVICE

(71) Applicant: FUJI ELECTRIC CO., LTD., Kawasaki-shi (JP)

(72) Inventors: Yasuhito Tanaka, Yokosuka (JP); Masakazu Gekinozu, Matsumoto (JP); Yukihiro Nishikawa, Kodaira (JP); Masaki Sakuma, Hino (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 287 days.

(21) Appl. No.: 14/680,559

(22) Filed: Apr. 7, 2015

(65) Prior Publication Data

US 2015/0216077 A1  Jul. 30, 2015

Related U.S. Application Data

(63) Continuation of application No. PCT/JP2014/000920, filed on Feb. 21, 2014.

(30) Foreign Application Priority Data

Mar. 19, 2013  (JP) ................. 2013-056931

(51) Int. Cl.
*H05K 7/00* (2006.01)
*H05K 7/20* (2006.01)
*H02M 7/00* (2006.01)

(52) U.S. Cl.
CPC ........ *H05K 7/20145* (2013.01); *H02M 7/003* (2013.01); *H05K 7/202* (2013.01); *H05K 7/20263* (2013.01); *H05K 7/20272* (2013.01); *H05K 7/20909* (2013.01); *H05K 7/20918* (2013.01); *H05K 7/20927* (2013.01)

(58) Field of Classification Search
None
See application file for complete search history.

(56) References Cited

U.S. PATENT DOCUMENTS

| | | | |
|---|---|---|---|
| 4,460,956 A | | 7/1984 | Hamasaki |
| 6,019,167 A | * | 2/2000 | Bishop ...................... F28F 1/10 165/104.19 |
| 6,822,856 B2 | | 11/2004 | Fujiwara |
| 7,245,485 B1 | * | 7/2007 | Morrell ................... G06F 1/181 361/679.48 |

(Continued)

FOREIGN PATENT DOCUMENTS

| | | |
|---|---|---|
| JP | S53-60706 U | 5/1978 |
| JP | S57-201086 U | 12/1982 |

(Continued)

*Primary Examiner* — Dimary Lopez Cruz
*Assistant Examiner* — Zhengfu Feng
(74) *Attorney, Agent, or Firm* — Rabin & Berdo, P.C.

(57) ABSTRACT

An electronic equipment cooling device is provided, which has housing in which heat-generating components are housed, and which can cool surfaces of the housing. A blower fan blows air toward the surfaces via a chamber room. An inclined flat plate-like partition portion is provided inside the chamber room so as to distribute a desired amount of air corresponding to a heat generating ratio of the respective surfaces.

12 Claims, 10 Drawing Sheets

(56) References Cited

U.S. PATENT DOCUMENTS

| | | | |
|---|---|---|---|
| 7,893,365 B2* | 2/2011 | Lewison | H05K 5/0021 |
| | | | 174/564 |
| 8,741,466 B2* | 6/2014 | Youngs | B60K 6/28 |
| | | | 165/80.3 |
| 9,596,791 B2 | 3/2017 | Sakuma et al. | |
| 2008/0007913 A1 | 1/2008 | Sullivan et al. | |
| 2009/0180251 A1* | 7/2009 | Biagini | H05K 7/20918 |
| | | | 361/690 |
| 2010/0039771 A1* | 2/2010 | Marchand | H05K 7/20909 |
| | | | 361/694 |
| 2010/0302730 A1* | 12/2010 | Hernon | H05K 7/20145 |
| | | | 361/694 |
| 2011/0108250 A1 | 5/2011 | Horng et al. | |
| 2012/0049788 A1 | 3/2012 | Kim et al. | |
| 2012/0155015 A1* | 6/2012 | Govindasamy | G06F 1/203 |
| | | | 361/679.46 |

FOREIGN PATENT DOCUMENTS

| | | | |
|---|---|---|---|
| JP | S58-83196 U | | 6/1983 |
| JP | S61 12290 | * | 1/1986 |
| JP | S61-12290 U | | 1/1986 |
| JP | S62-57295 A | | 3/1987 |
| JP | 2002-314281 A | | 10/2002 |
| JP | 2004-006558 A | | 1/2004 |
| JP | 2004006558 A | * | 1/2004 |
| JP | 2012-049497 A | | 3/2012 |
| JP | 2014150156 A | * | 8/2014 |

* cited by examiner

ELECTRONIC EQUIPMENT COOLING DEVICE AND POWER CONVERTER HAVING ELECTRONIC EQUIPMENT COOLING DEVICE

CROSS-REFERENCE TO RELATED APPLICATIONS

This application is a continuation under 35 U.S.C. 120 of International Application PCT/JP2014/000920 having the International Filing Date of Feb. 21, 2014, and having the benefit of the earlier filing date of Japanese Application No. 2013-056931, filed Mar. 19, 2013. All of the identified applications are fully incorporated herein by reference.

TECHNICAL FIELD

The present invention relates to an electronic equipment cooling device having a rectangular parallelepiped housing in which heat-generating components are incorporated and a power converter having the electronic equipment cooling device.

BACKGROUND ART

As this type of an electronic equipment cooling device, an electronic equipment cooling device disclosed in Patent Document 1, for example, is known.

A housing of this electronic equipment cooling device has a triple structure which includes rectangular parallelepiped inner, middle, and outer casings. Heat-generating components are incorporated in the inner casing. An inside air fan is attached to the inner casing and an opening is formed on a side facing the inside air fan. Moreover, the middle casing has corrugated louver fins that surround the inner casing and are formed on peripheral four surrounding surfaces facing the inner casing. Moreover, the outer casing has corrugated louver fins that surround the middle casing and are formed on peripheral four surrounding surfaces facing the middle casing. Further, an outside air fan is attached to the outer casing and an opening is formed on a side facing the outside air fan. Due to this, according to the electronic equipment cooling device disclosed in Patent Document 1, convection occurs due to the blowing of air by the inside air fan and the outside air fan, and heat inside the inner casing can be efficiently radiated by the corrugated louver fin surrounding the four interfacial surfaces of the casings.

Patent Document 1: Japanese Patent Application Publication No. 2004-6558

DISCLOSURE OF THE INVENTION

However, in the electronic equipment cooling device disclosed in Patent Document 1, since the respective four interfacial surfaces of the casings are surrounded by the corrugated louver fins in the same manner, it is difficult to adjust the amounts of air supplied from the fans and flowing toward the four surfaces individually. Due to this, the amount of supplied air is biased to a surface where the supplied air can easily flow among the four surfaces, hence there is room for further improvement to achieve radiation of heat more efficiently inside the inner casing.

The present invention has been made in view of such a problem and an object thereof is to provide an electronic equipment cooling device which has a rectangular parallelepiped housing in which heat-generating components are incorporated and which can cool two adjacent and orthogonal surfaces of the rectangular parallelepiped housing efficiently and a power converter having the same.

In order to attain the object, an aspect of the present invention provides an electronic equipment cooling device having a rectangular parallelepiped housing in which heat-generating components are incorporated, including at least Configurations 1 to 5 below.

(Configuration 1) The electronic equipment cooling device includes a heat radiating side-wall fin formed on a first side wall surface of the housing and a heat radiating bottom fin formed on a bottom surface of the housing.

(Configuration 2) Further, the electronic equipment cooling device includes a cover portion that covers the side-wall fin and the bottom fin from an outer side.

(Configuration 3) Further, the electronic equipment cooling device includes a chamber portion that defines a chamber room that faces a second side wall surface of the housing facing in a direction crossing the first side wall surface and that covers the second side wall surface so as to communicate with a space that the chamber room surrounds at a position further toward an inner side than the cover portion.

(Configuration 4) Further, the electronic equipment cooling device includes a coolant supply device that supplies a coolant from a coolant inlet port formed in an outer surface of the chamber portion into the chamber room.

(Configuration 5) Further, the electronic equipment cooling device includes a flat plate-like partition portion disposed in the chamber room so as to obliquely partition the chamber room to distribute the coolant from the coolant inlet port toward the two surfaces of the housing where the side-wall fin and the bottom fin are formed.

According to the electronic equipment cooling device according to one aspect of the present invention, the bottom surface and the first side wall surface of the housing are the two adjacent and orthogonal surfaces of the rectangular parallelepiped housing. Moreover, the chamber portion defines the chamber room that faces the second side wall surface of the housing facing in the direction crossing the first side wall surface in relation to the two surfaces. Moreover, the chamber room communicates with a space surrounding at a position further toward an inner side than the cover portion that covers the two surfaces from the outer side. Further, the coolant inlet port is provided on the outer surface of the chamber portion and the coolant supply device is configured to be able to supply a coolant from the coolant inlet port into the chamber room.

Thus, according to the electronic equipment cooling device, the coolant supply device can supply the coolant to each of the two surfaces via the chamber room. Moreover, the heat radiating fin is formed on each of the two surfaces and the heat radiating fins of the two surfaces are covered by the cover portion from the outer side. Thus, it is possible to efficiently cool the surfaces from the fins while forming the passage of the coolant from the coolant inlet port around the fins.

Moreover, the flat plate-like partition portion that obliquely partitions the inside of the chamber room is disposed in the chamber room so as to distribute the coolant from the coolant inlet port toward the two surface of the housing where the side-wall fin and the bottom fin are formed. Thus, it is possible to distribute the coolant according to a desired amount corresponding to the heat generating ratio to the two adjacent and orthogonal surfaces. Therefore, according to this electronic equipment cooling device, it is possible to efficiently cool the two adjacent and orthogonal surfaces of the rectangular parallelepiped housing.

In the electronic equipment cooling device according to an aspect of the present invention, the partition portion may be formed of a protruding portion formed integrally with the housing, the protruding portion being formed so as to protrude toward the chamber room while using the second side wall surface of the housing as a base end thereof. With such a configuration, preferably it is possible to form the partition portion having the function of distributing the coolant from the coolant inlet port toward the two adjacent and orthogonal surfaces of the rectangular parallelepiped housing so as to be integral with the housing.

Moreover, in the electronic equipment cooling device according to an aspect of the present invention, the partition portion may be provided as an independent component from the housing and may be detachably attached to an inside of the chamber room and an inclination angle of a flat plate-like surface thereof is adjustable. With such a configuration, preferably it is possible to adjust the function of distributing the coolant from the coolant inlet port toward the two adjacent and orthogonal surfaces of the rectangular parallelepiped housing. Moreover, with such a configuration, since a plurality of types of partition portions can be prepared, it is possible to ideally distribute the coolant in a desired amount corresponding to appropriate conditions such as the heat generating ratio of the respective surfaces.

In the electronic equipment cooling device according to an aspect of the present invention, the coolant may be water and a pump may be used as the coolant supply device. Moreover, the coolant may be air and a blower fan may be used as the coolant supply device.

If the coolant is air, when the blower fan is attached to a position located close to the first side wall surface of the housing and the corner created by one set of sides that the two surfaces share and the partition portion is disposed so that the flat plate-like surface thereof extends along an imaginary slope surface including the corner created by one set of sides that the two surfaces share, one blower fan can ideally distribute a desired amount of air corresponding to the heat generating ratio of the respective surfaces to the two adjacent and orthogonal surfaces.

Moreover, when the coolant is air, it is preferable that the coolant inlet port is open in a rectangular shape, and the rectangular opening is disposed so that a direction of one diagonal line thereof extends along an inclination direction of the flat plate-like surface of the partition portion. With such a configuration, it is possible to more ideally distribute the air supplied from the blower fan toward the two adjacent and orthogonal surfaces of the rectangular parallelepiped housing to cool the surfaces.

In order to attain the object, another aspect of the present invention provides a power converter including an electronic equipment cooling device having a rectangular parallelepiped housing in which heat-generating components are incorporated, the power converter being configured in which at least a power conversion control unit is incorporated in the housing as the heat-generating component; a control connector, an input connector, and an output connector are provided in the housing; when a control signal is input to the control connector, commercial power input to the input connector is converted from AC to DC by the power conversion control unit and is output as DC power from the output connector, wherein the electronic equipment cooling device according to the aspect of the present invention included as the electronic equipment cooling device.

According to the power converter according to the aspect of the present invention, since the power converter includes the electronic equipment cooling device according to the aspect of the present invention, it is possible to distribute the coolant in a desired amount corresponding to the heat generating ratio of the respective surfaces to the two adjacent and orthogonal surfaces. Therefore, according to this power converter, it is possible to efficiently cool the two adjacent and orthogonal surfaces of the rectangular parallelepiped housing.

As described above, according to the present invention, in an electronic equipment cooling device which has a rectangular parallelepiped housing in which heat-generating components are incorporated, and a power converter having the same, it is possible to cool two adjacent and orthogonal surfaces of the rectangular parallelepiped housing efficiently.

BEST MODE FOR CARRYING OUT THE INVENTION

Hereinafter, a first embodiment of a power converter having an electronic equipment cooling device according to an aspect of the present invention will be described appropriately with reference to the drawings.

Figure 1:
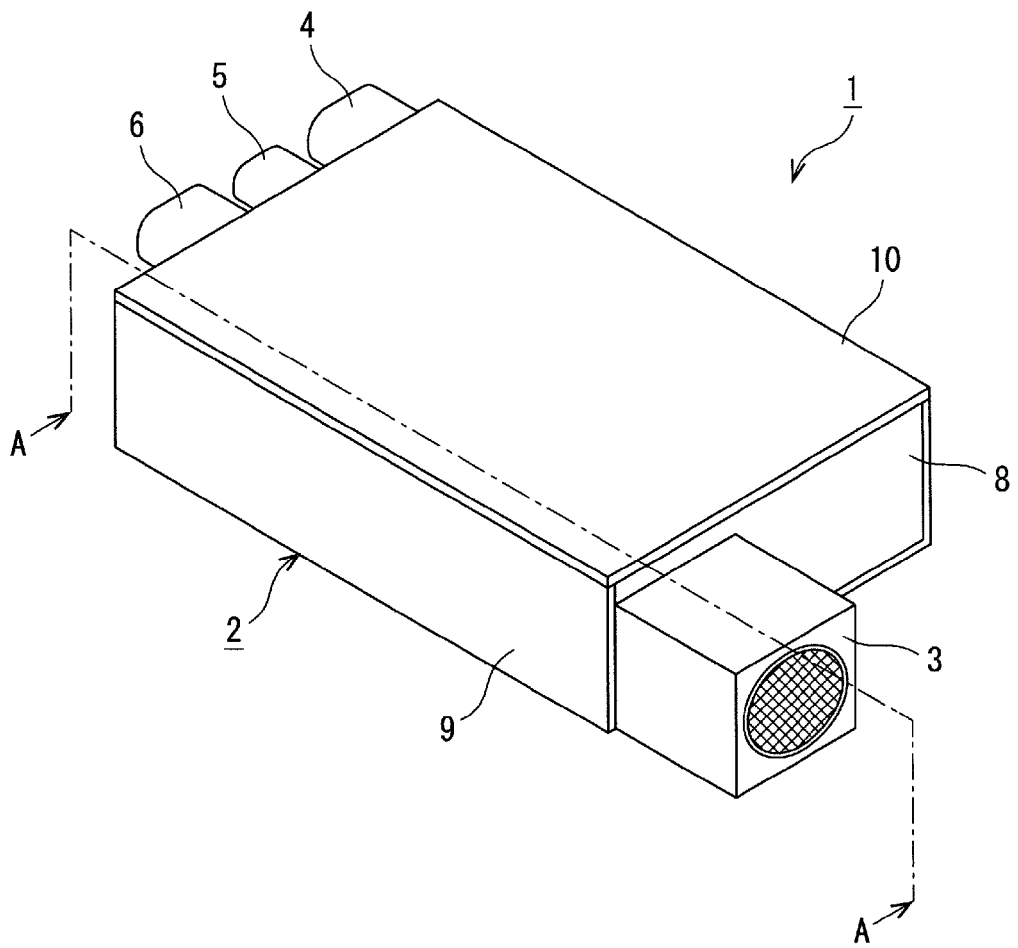
FIG. 1 is a perspective view illustrating an appearance of a first embodiment (an example where coolant is air) of a power converter having an electronic equipment cooling device according to an aspect of the present invention.

As illustrated in FIG. 1, a power converter 1 has a rectangular parallelepiped housing 2. A blower fan 3 as a coolant supply device is externally attached to one side surface in the longitudinal direction of the housing 2. Moreover, an input connector 4, a control connector 5, and an output connector 6 are provided in parallel on the other side surface in the longitudinal direction of the housing 2. A power conversion control unit described later is incorporated in the housing 2. When a control signal is input to the control connector 5, commercial power input to the input connector 4 is converted from AC to DC by the power conversion control unit and is output as DC power from the output connector 6.

Figure 2:
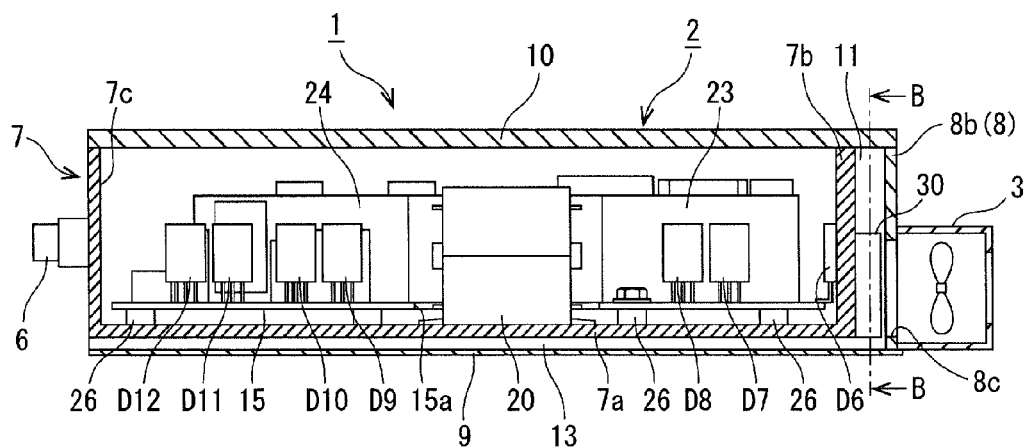
FIG. 2 is a cross-sectional view along line A-A in FIG. 1.
Figure 5:
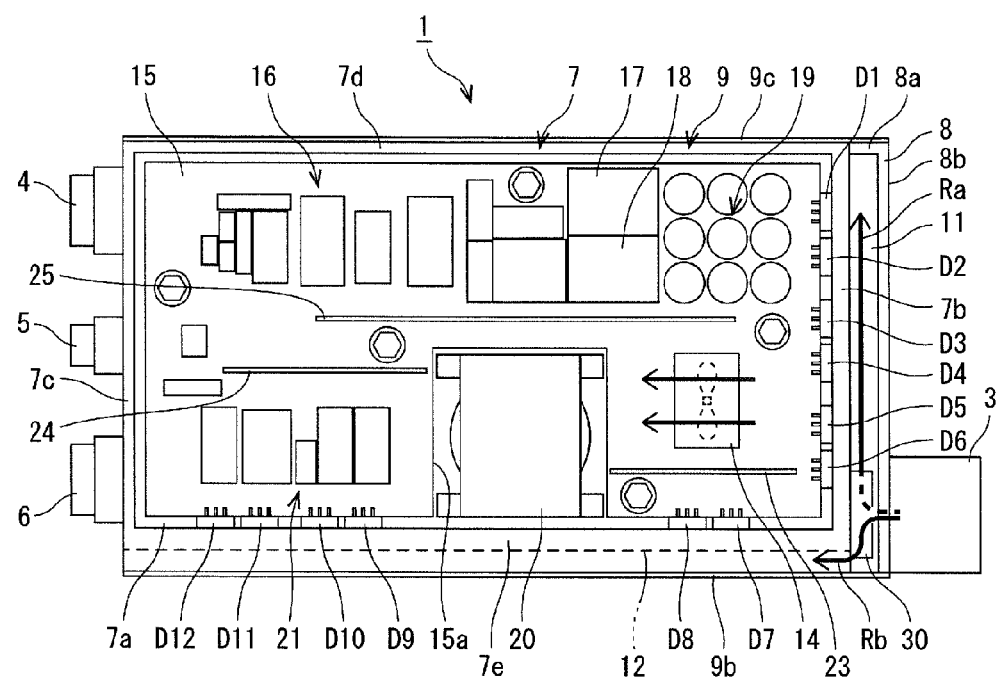
FIG. 5 is a plan view illustrating an inside of the power converter according to the first embodiment with a lid removed.

Specifically, as shown in FIG. 2 the rectangular parallelepiped housing 2 includes a casing 7, a chamber forming wall 8, a housing cover 9, and a lid 10. The casing 7 has a bottomed box shape and a rectangular plan-view shape, and as illustrated in FIG. 5, includes a rectangular bottom portion 7a and a pair of short-side side wall 7b and 7c and a pair of long-side side walls 7d and 7e erected from four sides of the bottom portion 7a. The casing 7 is formed by die-casting aluminum or an aluminum alloy having high heat conductivity, for example. The chamber forming wall 8 is disposed on one side in the longitudinal direction of the casing 7 and a predetermined gap is formed between the chamber forming wall 8 and the side wall of the casing 7. The housing cover 9 is formed so as to cover a portion of the casing 7 and the chamber forming wall 8. The lid 10 is provided so as to block an upper opening of the casing 7 and the chamber forming wall 8 to seal the inside of the housing 2. As illustrated in FIG. 5, the chamber forming wall 8 includes a contacting wall 8a that makes contact with one short-side side wall 7b of the casing 7 and a facing wall 8b that faces the one short-side side wall 7b of the casing 7, which form a chamber portion.

Figure 3:
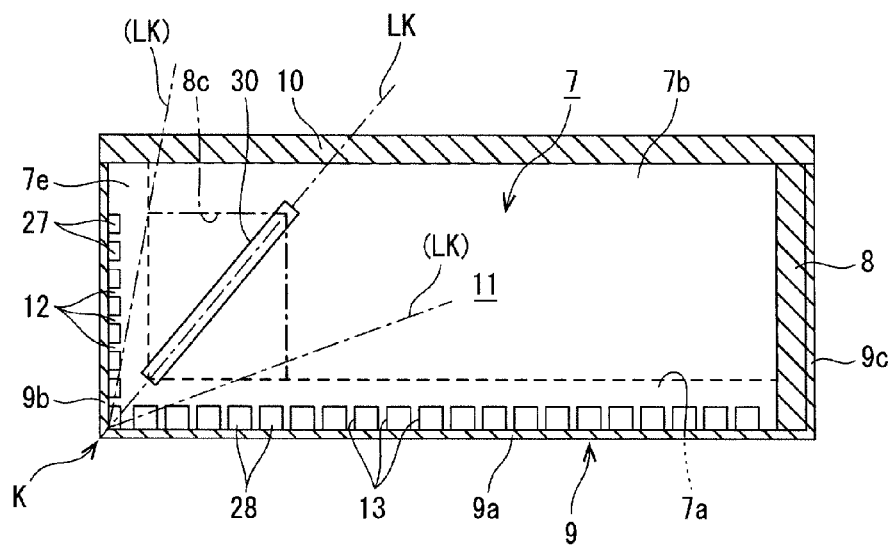
FIG. 3 is a cross-sectional view along line B-B in FIG. 2.
Figure 4:
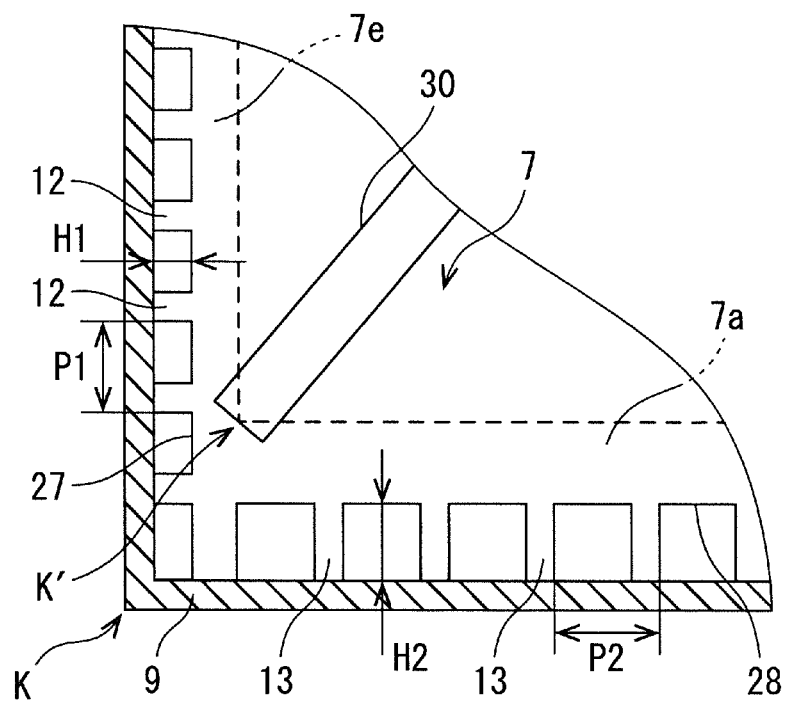
FIG. 4 is an enlarged view of a main part of FIG. 3.

Here, as illustrated in FIG. 3, a plurality of side-wall fins 12 extending in the longitudinal direction is formed on a region on the outer side of one long-side side wall 7e of the casing 7, extending from a lower end to an upper portion. The plurality of side-wall fins 12 is formed in parallel at predetermined intervals in a vertical direction of the long-side side wall 7e. As illustrated in FIG. 4, a fin height of each side-wall fin 12 is set to H1 and the pitch of the side-wall fins 12 is set to P1. As illustrated in FIG. 5, no side-wall fin is formed on the outer side of the other long-side side wall 7d of the casing 7.

Moreover, as illustrated in FIG. 3, a plurality of bottom fins 13 extending in the longitudinal direction is also formed on a region of a lower surface of the bottom portion 7a of the casing 7, extending from a lower end to the right side. The plurality of bottom fins 13 is formed in parallel at predetermined intervals in a lateral direction of the bottom portion 7a. As illustrated in FIG. 4, a fin height of each bottom fin 13 is set to H2 (H2>H1) larger than the fin height H1 of the side-wall fin 12. Further, the pitch of the bottom fins 13 is set to P2 (P2>P1) larger than the pitch P1 of the side-wall fins 12.

The housing cover 9 is a cover member that covers the side-wall fins 12 and the bottom fins 13 from the outer side. As illustrated in FIGS. 3 and 5, the housing cover 9 includes a rectangular bottom plate 9a that covers a lower opening of the chamber forming wall 8 and the bottom portion 7a of the casing 7 and a pair of side plates 9b and 9c that is erected from the edges of the bottom plate 9a so as to cover the lateral portions of the chamber forming wall 8 and the pair of long-side side walls 7d and 7e of the casing 7.

As illustrated in FIG. 3, the spaces between the plurality of side-wall fins 12 and the spaces between the plurality of bottom fins 13 on the outer circumferences of one of the pair of long-side side walls 7e and the bottom portion 7a of the casing 7 covered with the housing cover 9 form a plurality of passages 27 and 28 extending in the longitudinal direction of the casing 7. Moreover, the lid 10 is fixed to the casing 7 and the chamber forming wall 8 so as to block the upper opening of the chamber forming wall 8 and the casing 7. In this manner, a space on the inner side surrounded by one short-side side wall 7b of the casing 7, the chamber forming wall 8, the housing cover 9, and the lid 10 is defined as a chamber room 11.

One set of ends in the longitudinal direction of the plurality of passages 27 and 28 formed between the housing cover 9 and the outer circumferences of one of the pair of long-side side walls 7e and the bottom portion 7a of the casing 7 communicates with the chamber room 11 and the other set of ends of the passages 27 and 28 communicates with the atmosphere. An opening 8c serving as a coolant inlet port is formed in the facing wall 8b of the chamber forming wall 8. The blower fan 3 is attached such that a ventilation port of the blower fan 3 faces the position of the opening 8c, and cool air generated by the blower fan 3 is blown into the chamber room 11 as a coolant.

Here, a flat plate-like partition portion 30 is provided in the chamber room 11. This partition portion 30 is a partition member that distributes the air supplied from the blower fan 3 toward the long-side side wall 7e and the bottom plate 9a (hereinafter, the long-side side wall 7e and the bottom plate 9a will be referred to simply as "two surfaces") of the casing 7, which are two adjacent and orthogonal surfaces of the housing 2. The partition portion 30 of the present embodiment is configured of a protruding portion by being integrated with the casing 7 as a result of die-casting the casing 7 that constitutes the housing 2. That is, the partition portion 30 formed as a protruding portion has a base end on the short-side side wall 7b of the casing 7 and is formed obliquely so as to protrude toward the chamber room 11 and distribute the air supplied from the blower fan 3.

Here, the blower fan 3 of the present embodiment is attached to a position close to a corner (indicated by symbol K in FIGS. 3 and 4) created by one set of sides that the two surfaces 7a and 7e of the housing 2 share. Further, the flat plate-like surface of the partition portion 30 is disposed along an imaginary slope surface (indicated by symbol Lk in FIG. 3) that includes the corner K created by one set of sides that the two surfaces 7a and 7e share. The imaginary slope surface may also be referred to as a slope line. Moreover, as illustrated in FIG. 3, the opening 8c of the present embodiment is open in a rectangular shape (in the example illustrated in the drawing, in an approximately square shape) of which each side is parallel to the two surfaces 7a and 7e, and this rectangular opening 8c is disposed so that the direction of one diagonal line thereof is approximately identical to the inclination direction of the flat plate-like surface of the partition portion 30.

The "imaginary slope surface Lk including the corner K" may be an optional imaginary surface that passes through the point of the corner K and an optional point on the opening 8c, and the extension direction (the direction orthogonal to the drawing surface of FIG. 3) of the imaginary slope surface Lk is the direction along the plurality of passages 27 and 28 extending in the longitudinal direction of the casing 7. For example, as illustrated in FIG. 3, the imaginary slope surface Lk can be set appropriately so that a range indicated by symbols (LK) above and below the imaginary slope surface Lk at the center of the drawing, inclined at approximately 45° has a desired amount of supplied air corresponding to the heat generation ratio of the respective surfaces 7a and 7e. The point of the corner K does not mean strictly the corner of the housing 2 but includes a point near the corner K without departing from the spirit of the present invention. In particular, when such a rectangular opening 8c as in the present embodiment is formed, the point can be selected based on the corner (K' in FIG. 4) of the opening 8c, located closest to the corner K created by one set of sides that the two surfaces 7a and 7e share.

Figure 6:
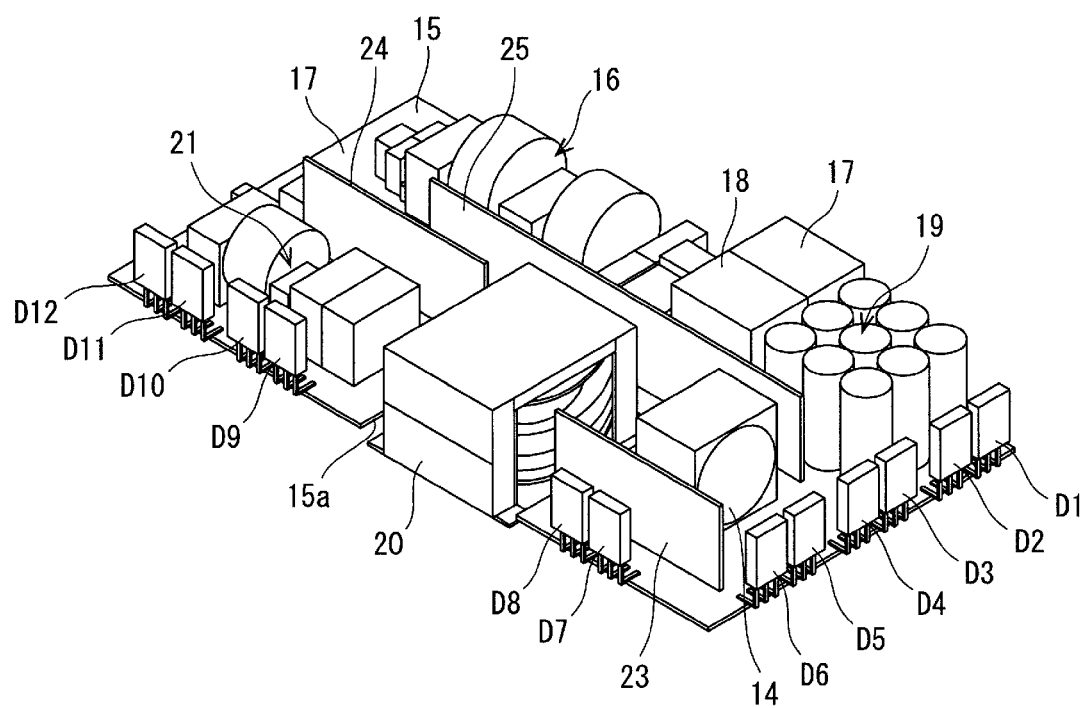
FIG. 6 is a perspective view illustrating control components of the power converter according to the first embodiment.

The power conversion control unit and an inner fan 14 are accommodated in the casing 7. As illustrated in FIGS. 5 and 6, the power conversion control unit includes control components including a base substrate 15, an input-side noise filter unit 16, a first reactor 17, a second reactor 18, an electrolytic capacitor group 19, the transformer 20, an output-side noise filter unit 21, a plurality of semiconductor devices (for example, MOSFETs) D1 to D12, and first to third circuit boards 23 to 25.

The base substrate 15 is a member which has a rectangular shape that is smaller than a plan-view shape of the bottom portion 7a of the casing 7 and in which a notch 15a is formed on one long side. A predetermined wiring pattern (not illustrated) connected to the input connector 4, the control connector 5, and the output connector 6 is formed in the base substrate 15. The base substrate 15 is fixed by bolts to a support 26 formed on the upper surface of the bottom portion 7a of the casing 7 in a state where the notch 15a faces one long-side side wall 7e of the casing 7 (see FIG. 2).

The input-side noise filter unit 16, the first reactor 17, the second reactor 18, the electrolytic capacitor group 19, the output-side noise filter unit 21, the semiconductor device D1 to D12, and the first to third circuit boards 23 to 25 are mounted on the base substrate 15. The transformer 20 disposed on the inner side of the notch 15a of the base substrate 15 is fixed so as to make direct contact with the bottom portion 7a of the casing 7, and the inner fan 14 is disposed on the base substrate 15.

A specific layout of the control components and the inner fan 14 will be described with reference to FIG. 5.

The semiconductor devices D1 to D6 are mounted at predetermined intervals in parallel along one short side of the base substrate 15. The semiconductor devices D1 to D6 are positioned so that the semiconductor devices make direct contact with one short-side side wall 7b of the casing 7, defining the chamber room 11. Another semiconductor devices D7 to D12 are mounted at predetermined intervals in parallel along one long side of the base substrate 15. The semiconductor devices D2 to D12 are positioned so that the semiconductor devices make direct contact with one long-side side wall 7e of the casing 7, forming the side-wall fins 12.

Moreover, the third circuit board 25 is mounted at a central position in the lateral direction of the base substrate 15 so as to be erected while extending in the longitudinal direction. The second circuit board 24 is mounted on the base substrate 15 at a position close to the other short-side side wall 7c of the casing 7 so as to be erected in parallel to the third circuit board 25 while extending in the longitudinal direction. Moreover, the input-side noise filter unit 16, the first reactor 17, the second reactor 18, and the electrolytic capacitor group 19 are mounted on the base substrate 15 so as to be positioned between the third circuit board 25 and the other long-side side wall 7d of the casing 7. Moreover, the output-side noise filter unit 21 is mounted on the base substrate 15 so as to be positioned between the second circuit board 24 and one long-side side wall 7e of the casing 7.

Moreover, the inner fan 14 is disposed on a portion of the base substrate 15 surrounded by the transformer 20, the third circuit board 25, and one short-side side wall 7b and one long-side side wall 7e of the casing 7. When air is blown from the inner fan 14, cool air is blown in a direction (indicated by an arrow in FIG. 5) toward the transformer 20. Further, the first circuit board 23 is disposed between the inner fan 14 and one long-side side wall 7e of the casing 7 and is mounted on the base substrate 15 while having a function of guiding the cool air generated by the inner fan 14 to the transformer 20. Moreover, with the air blasting of the inner fan 14, heat inside the housing 2 circulates by convection, and the heat of the control components and the like can be delivered efficiently to the wall surfaces of the rectangular parallelepiped housing 2.

Next, the operation of the power converter 1 and the cooling effect and the operational effects of the electronic equipment cooling device included therein will be described.

In the power converter 1 according to the present embodiment, when a control signal is input to the control connector 5, commercial power input to the input connector 4 is converted from AC to DC by the power conversion control unit accommodated in the casing 7 and is output as DC power from the output connector 6. In this case, the control components such as the transformer 20 and the power conversion control unit in the casing 7 generate heat, and in particular, the semiconductor devices D1 to D12, the transformer 20, the first reactor, the second reactor, and the electrolytic capacitor group 19 generate a large amount of heat.

Here, in this power converter 1, the electronic equipment cooling device included in the power converter 1 includes the chamber room 11 and the blower fan 3, and the bottom portion 7a and the long-side side wall 7e of the casing 7 serve as two adjacent and orthogonal surfaces of the rectangular parallelepiped housing 2. When the blower fan 3 is driven, the air drawn from the outside is blown into the chamber room 11 as cool air. The cool air blown into the chamber room 11 enters into the plurality of passages 28 formed on the bottom portion 7a of the casing 7 communicating with the chamber room 11 and the plurality of passages 27 formed on one long-side side wall 7e and is discharged outside by flowing toward the other end (the other short-side side wall 7c) in the longitudinal direction along the plurality of side-wall fins 12 and the plurality of bottom fins 13.

Here, when the cool air is blown from the blower fan 3 to the chamber room 11, since the area of an outer wall of one short-side side wall 7b of the casing 7 with which the cool air makes contact increases, one of the pair of the short-side side walls 7b serves as a cooling body. Moreover, when the cool air of the chamber room 11 flows into the plurality of passages 28 formed on the bottom portion 7a, since the area of portions of the plurality of bottom fins 13 with which the cool air makes contact increases, the bottom portion 7a also serves as a cooling body. Further, when the cool air of the chamber room 11 flows into the plurality of passages 27 formed on one long-side side wall 7e, since the area of portions of the plurality of side-wall fins 12 with which the cool air makes contact increases, one of the pair of the long-side side walls 7e also serves as a cooling body.

Figure 7:
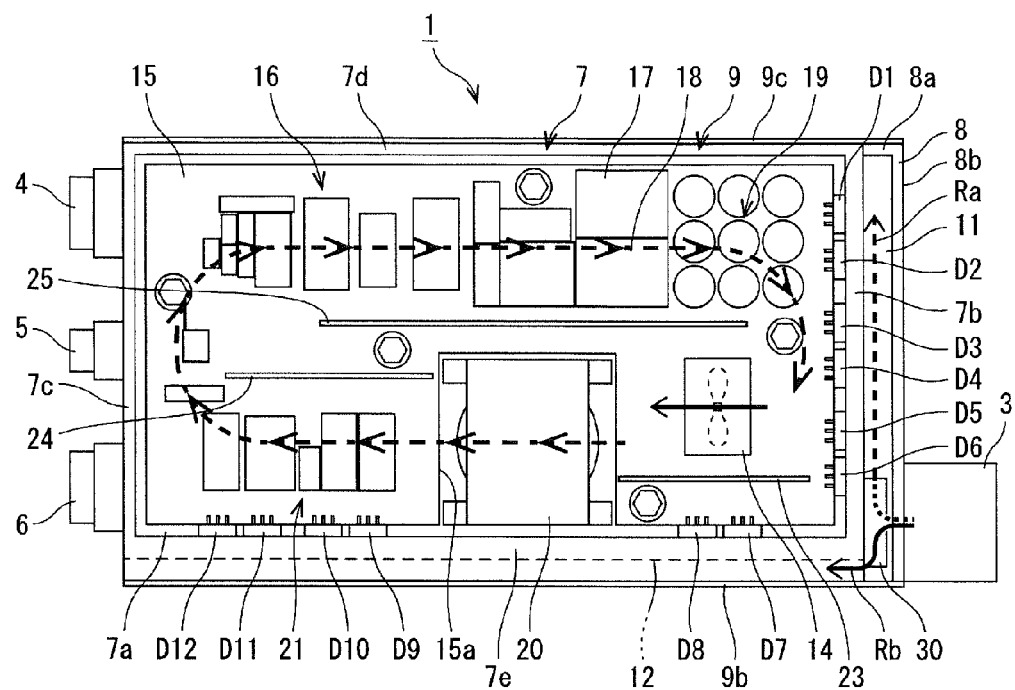
FIG. 7 is a diagram illustrating the flow of cold air in a casing generated with driving of an inner fan.

Moreover, when the inner fan 14 disposed on the base substrate 15 is driven, the third circuit board 25 and the second circuit board 24 erected and mounted at the central position in the lateral direction of the base substrate 15 function as a wind guiding plate, and a flow of cool air which circulate in the order of the transformer 20, the output-side noise filter unit 21, the input-side noise filter unit 16, the first reactor, the second reactor, and the electrolytic capacitor group 19 is generated as indicated by a broken-line arrow in FIG. 7.

Here, the chamber room 11 is disposed so as to face the short-side side wall 7b that faces in a direction crossing the long-side side wall 7e in relation to the two surfaces 7a and 7e, and the blower fan 3 that blows air from the rectangular opening 8c serving as a coolant inlet port into the chamber room 11 is attached to the outer surface of the facing wall 8b that defines the chamber room 11. Thus, as indicated by arrows Ra and Rb in FIG. 7, one blower fan 3 can blow air toward the two surfaces 7a and 7e via the chamber room 11. Moreover, according to this power converter 1, since the heat radiating fins 12 and 13 of the two surfaces 7a and 7e are covered by the housing cover 9 from the outer side, it is possible to radiate heat from the fins 12 and 13 while forming the passages 27 and 28 for the air blown by the blower fan 3 around the fins 12 and 13.

Since the semiconductor devices D1 to D6 are mounted so as to make direct contact with one short-side side wall 7b of the casing 7 serving as a cooling body with the aid of the cool air flowing into the chamber room 11, the heat generated by the semiconductor devices D1 to D6 is efficiently radiated to one short-side side wall 7b and the semiconductor devices D1 to D6 can be cooled reliably.

Moreover, since the semiconductor devices D7 to D12 are mounted so as to make direct contact with one long-side side wall 7e of the casing 7 serving as a cooling body, cool air flows through the plurality of passages 27 of the long-side side wall 7e as indicated by arrow Rb in FIG. 7, whereby the heat generated by the semiconductor devices D7 to D12 is efficiently radiated to one long-side side wall 7e and the semiconductor devices D7 to D12 can be cooled reliably.

Furthermore, since the transformer 20 is fixed so as to make direct contact with the bottom portion 7a of the casing 7 serving as a cooling body, the cool air having passed through the chamber room 11 as indicated by arrow Ra in FIG. 7 flows into the plurality of passages 28 with the aid of the plurality of bottom fins 13 formed on the bottom portion 7a, whereby the heat generated by the transformer 20 is efficiently radiated to the bottom portion 7a and the transformer 20 is cooled reliably.

Moreover, the heat inside the housing 2 generated by the first reactor, the second reactor, and the electrolytic capacitor group 19 is reliably cooled by the cool air circulating inside the casing 7 generated by the driving of the inner fan 14. Since the cool air circulating inside the casing 7 is radiated by coming in contact with one short-side side wall 7b and one long-side side wall 7e of the casing 7 which is a cooling body and the bottom portion 7a of the casing 7, the cool air circulates around the first reactor, the second reactor, and the electrolytic capacitor group 19, whereby the cooling effect can be enhanced.

In particular, according to the power converter 1, since the flat plate-like partition portion 30 that obliquely partitions the inside of the chamber room 11 so as to distribute the air from the blower fan 3 toward the two surfaces 7a and 7e is disposed inside the chamber room 11, it is possible to distribute a desired amount of air corresponding to the heat generating ratio of the respective surfaces 7a and 7e to the two adjacent and orthogonal surfaces 7a and 7e. Thus, according to the electronic equipment cooling device having the power converter 1, it is possible to efficiently cool the two adjacent orthogonal surfaces 7a and 7e of the rectangular parallelepiped housing 2.

Moreover, the blower fan 3 is attached to a position located near the long-side side wall 7e of the housing 2 and near the corner K created by one set of sides that the two surfaces 7a and 7e share, and the flat plate-like surface of the partition portion 30 is disposed along the imaginary slope surface Lk including the corner K created by one set of sides that the two surfaces 7a and 7e share. Thus, one blower fan 3 can ideally distribute a desired amount of supplied air corresponding to the heat generation ratio of the respective surfaces 7a and 7e to the adjacent and orthogonal two surfaces 7a and 7e.

Further, the opening 8c which is a coolant inlet port of the chamber room 11 is open in a rectangular shape, and this rectangular opening is disposed so that the direction of one diagonal line thereof extends along the inclination direction of the flat plate-like surface of the partition portion 30. Thus, it is possible to distribute the air supplied from the blower fan 3 toward the two adjacent and orthogonal surfaces 7a and 7e of the rectangular parallelepiped housing 2 more ideally than a circular opening 8c, for example, and to provide an efficient cooling effect.

Moreover, the partition portion 30 is formed of a protruding portion formed integrally with the casing 7, with the protruding portion being formed so as to protrude toward the chamber room 11 while using the short-side side wall 7b as abase end thereof. Thus, it is possible to ideally provide the function of distributing the air supplied from the blower fan 3 toward the two adjacent and orthogonal surfaces 7a and 7e of the rectangular parallelepiped housing 2 to the portion formed integrally with the housing 2.

The electronic equipment cooling device and the power converter having the same according to the present invention are not limited to the embodiment, but various modifications are possible without departing from the spirit of the present invention.

Figure 8:
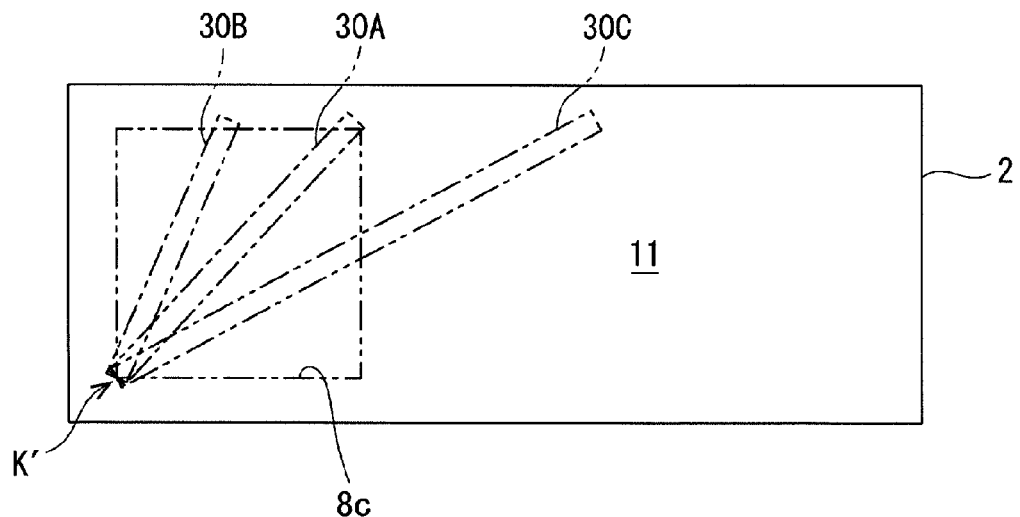
FIG. 8 is a diagram (a schematic view of FIG. 3) for describing a modification of a partition portion.

For example, in the embodiment, although the flat plate-like partition portion 30 is configured as the protruding portion formed integrally with the casing 7 of the housing 2 by die-cast molding, the present invention is not limited to this. For example, the partition portion 30 may be provided as an independent component from the casing 7 and be detachably attached to the inner side of the chamber room 11. Moreover, in this case, the inclination angle of the flat plate-like surface may be adjustable. FIG. 8 illustrates a modification having such a configuration.

As illustrated in the drawing, when the partition portion 30 is an independent component from the casing 7, it is possible to ideally distribute a desired amount of supplied air corresponding to the heat generating ratio of the respective surfaces 7a and 7e to the two adjacent and orthogonal surfaces 7a and 7e. The partition portion 30 configured as an independent component may be fastened to the short-side side wall 7b close to the casing 7 by screws or the like or may be fastened to the inner wall surface close to the chamber room 11 by screws or the like.

Here, if the inclination angle can be adjusted, in the example illustrated in the drawing, when the partition portion 30 is attached to a position (the position close to the long-side side wall 7e where the inclination angle is larger than 45°) indicated by 30B in the drawing in relation to the opening 8c to distribute the amount of supplied air toward the long-side side wall 7e (on the side-wall fin 12 side) and the bottom plate 9a (on the bottom fin 13 side), it is possible to control the amount of air supplied to the bottom plate 9a (on the bottom fin 13 side) to be larger than the amount of air supplied to the long-side side wall 7e (on the side-wall fin 12 side).

Moreover, when the partition portion 30 is attached to a position (the position where the inclination angle of the imaginary slope surface Lk is approximately 45°) indicated by 30A in the drawing in relation to the opening 8c, it is possible to control the amount of air supplied to the long-side side wall 7e (on the side-wall fin 12 side) to be approximately the same as the amount of air supplied to the bottom plate 9a (on the bottom fin 13 side). Moreover, when the partition portion 30 is attached to a position (the position close to the bottom plate 9a where the inclination angle is smaller than 45°) indicated by 30C in the drawing in relation to the opening 8c, it is possible to control the amount of air supplied to the bottom plate 9a (on the bottom fin 13 side) to be smaller than the amount of air supplied to the long-side side wall 7e (on the side-wall fin 12 side).

In particular, as indicated by 30A to 30C in the drawing, according to such a configuration, since a plurality of types of partition portions can be prepared (in the example illustrated in the drawing, since the plates have different lengths (30A<30B<30C), it is possible to ideally distribute a desired amount of supplied air corresponding to the heat generating ratio of the respective surfaces according to appropriate conditions. In this example, the corner K' of the opening 8c is selected as the reference corner of the inclination of the imaginary slope surface Lk.

Moreover, for example, in the first embodiment, although air is used as a coolant and the blower fan is provided as the coolant supply device, the present invention is not limited to this but water may be used as a coolant. Hereinafter, a second embodiment will be described with reference to FIGS. 9 to 13.

In the second embodiment, water is used as a coolant and a pump is provided as the coolant supply device. Since the second embodiment has the same configuration as the first embodiment except the configuration corresponding to the fact that water is used as a coolant, only the difference will be described, and the same portions corresponding to those of the first embodiment will be denoted by the same reference numerals as the first embodiment, and redundant description thereof will not be provided.

Figure 9:
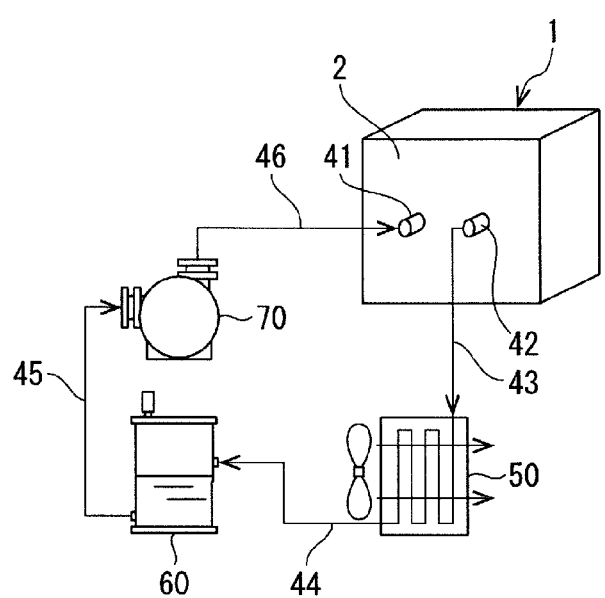
FIG. 9 is a schematic explanatory view illustrating a system configuration of a second embodiment (an example where coolant is water) of a power converter having the electronic equipment cooling device of an aspect of the present invention.

The power converter 1 of the second embodiment is used for charging a battery mounted in an electric vehicle, a hybrid vehicle, or the like, for example. As illustrated in FIG. 9 illustrating a system configuration of the second embodiment, in the present embodiment the power converter 1 includes a heat exchanger 50, a reservoir tank 60, and a pump 70 in order to circulate cooling water. In the power converter 1, a cooling water supply port 41 and a cooling water discharge port 42 are provided so as to be exposed to the outside of the housing 2. The cooling water discharge port 42 is connected to the heat exchanger 50 by the discharge pipe 43. The heat exchanger 50 may be an air-cooled radiator or the like mounted in a vehicle. The cooling water supply port 41 is connected to the pump 70 by a supply pipe 46. The reservoir tank 60 storing cooling water is provided between the heat exchanger 50 and the pump 70, and the reservoir tank 60 is connected between the heat exchanger 50 and the pump 70 by pipes 44 and 45.

In this cooling system, when the cooling water stored in the reservoir tank 60 is pressurized by the pump 70, the cooling water is supplied from the cooling water supply port 41 to the power converter 1. Moreover, the cooling water heated inside the power converter 1 is discharged from the cooling water discharge port 42 and is introduced to the heat exchanger 50. The heated cooling water cools down the inside of the power converter 1 by a cycle that the cooling water is cooled by heat-exchanging with the cool air by the heat exchanger 50 and is stored in the reservoir tank 60 again.

Here, in the first embodiment, since the coolant is air, the chamber room 11 does not require perfect sealing. In contrast, in the power converter 1 of the second embodiment, as illustrated in FIGS. 10 to 13, the surroundings of a space (hereinafter referred to as a "cooling room") that surrounds the space defining the chamber room 11 and the bottom fins 13 and the side-wall fins 12 communicating with the chamber room 11 are liquid-sealed reliably. Due to this, leakage of the cooling water from the cooling room and the chamber room 11 is prevented.

Specifically, as illustrated in FIGS. 10 to 13, in the present embodiment, the housing cover 9 and the portion corresponding to the chamber forming wall 8 are formed integrally. The housing cover 9 and the chamber forming wall 8 are integrally formed by die-casting aluminum or an aluminum alloy having high heat conductivity, for example. However, the housing cover 9 and the chamber forming wall 8 may be formed as separate components as long as these components are reliably liquid-sealed by a packing or the like.

Moreover, although the lid 10 that covers the upper portion of the housing 2 can be detached, a packing is interposed between mutual bonding surfaces of the rear surface of the lid 10 and the upper end surfaces of the housing cover 9 and the chamber forming wall 8. In the example of the present embodiment, flanges 8g and 9g are formed on the upper ends of the housing cover 9 and the chamber forming wall 8. A liquid packing 10p is coated on the upper surfaces of the flanges 8g and 9g and the upper end surfaces of the housing cover 9 and the chamber forming wall 8 so as to surround the upper opening, and the lid 10 is fixed to the flanges 8g and 9g by a fixing member such as a screw. In this way, the upper opening of the chamber room 11 and the cooling room is liquid-sealed and leakage of the cooling water from the rear surface portion of the lid 10 is prevented.

Figure 12:
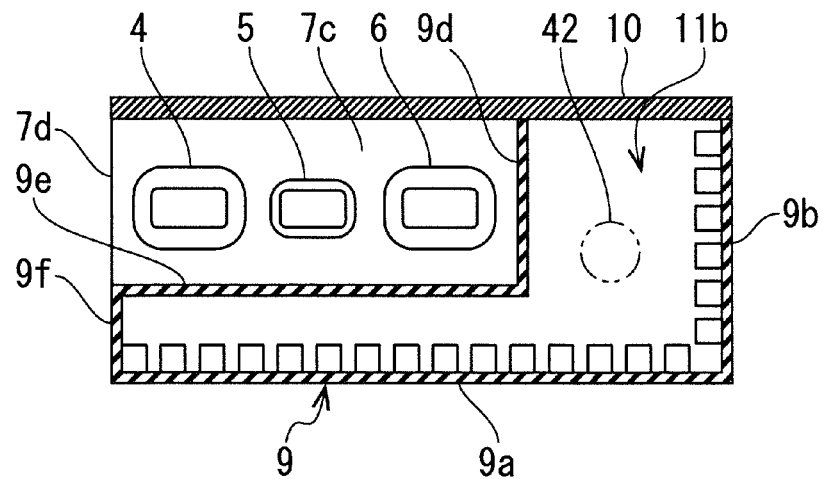
FIG. 12 is a cross-sectional view along line C-C in FIG. 11.

In particular, in the first embodiment, the side of the short-side side wall 7c where the connectors 4, 5, and 6 are provided is exposed to the atmosphere. In contrast, in the second embodiment, as illustrated in FIG. 12, the layout of the connectors 4, 5, and 6 is moved to a position close to the long-side side wall 7d and a second chamber room 11b having an approximately L shape (the space defined by walls 9d, 9e, 9f, 9a, and 9b and the rear surface of the lid 10 in FIG. 12) is provided in a portion close to the long-side side wall 7e facing the short-side side wall 7c. In this way, the side of the short-side side wall 7c has a sealed structure. Although the side plate 9b of the housing cover 9 and the long-side side wall 7d of the casing 7 are illustrated as being on the identical surface, this is a schematic view, and the position in the thickness direction of the side plate 9b and the long-side side wall 7d and the dividing position thereof can be set appropriately as long as the leakage of cooling water into the casing 7 in relation to the chamber rooms 11 and 11b and the "cooling room" is prevented.

Moreover, the cooling water supply port 41 is provided on an outer surface of the facing wall 8b on a side where the flat plate-like partition portion 30 is disposed so as to communicate with the chamber room 11. Moreover, the cooling water discharge port 42 is provided on an outer surface of the side plate 9h on the opposite side of the side where the partition portion 30 is disposed so as to communicate with the second chamber room 11b. In this example, the cooling water supply port 41 and the cooling water discharge port 42 are disposed on approximately the same axial line.

Figure 13:
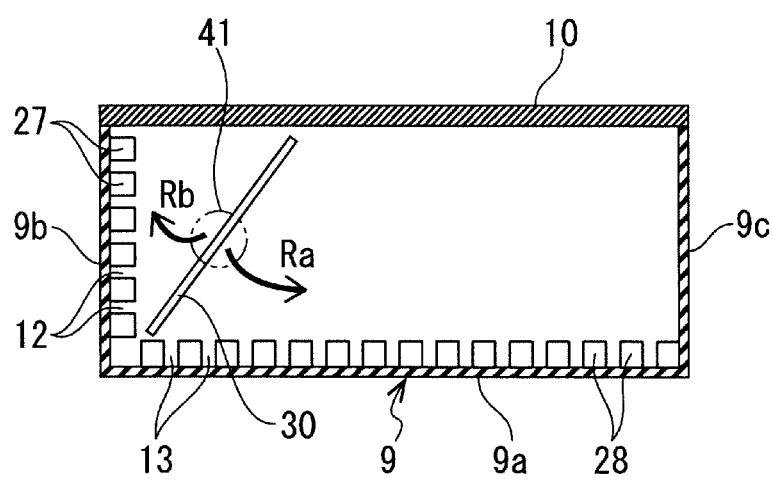
FIG. 13 is a cross-sectional view along line D-D in FIG. 11.

Here, as illustrated in FIG. 13, in the second embodiment, the partition portion 30 is obliquely partitioned so that the coolant from the coolant inlet port is distributed toward the two surfaces 7a and 7e of the housing 2. In the example of the present embodiment, although the cooling water supply port 41 and the cooling water discharge port 42 are cylindrical pipe members, the partition portion 30 obliquely partitions the position passing the center of the circular opening 8c of the cooling water supply port 41. The inclination direction and angle of the partition portion 30 and the partitioning ratio of the cooling water supply port 41 are appropriately set so that a desired amount of cooling water corresponding to the heat generating ratio of the respective surfaces 7a and 7e is distributed similarly to the first embodiment.

Figure 10:
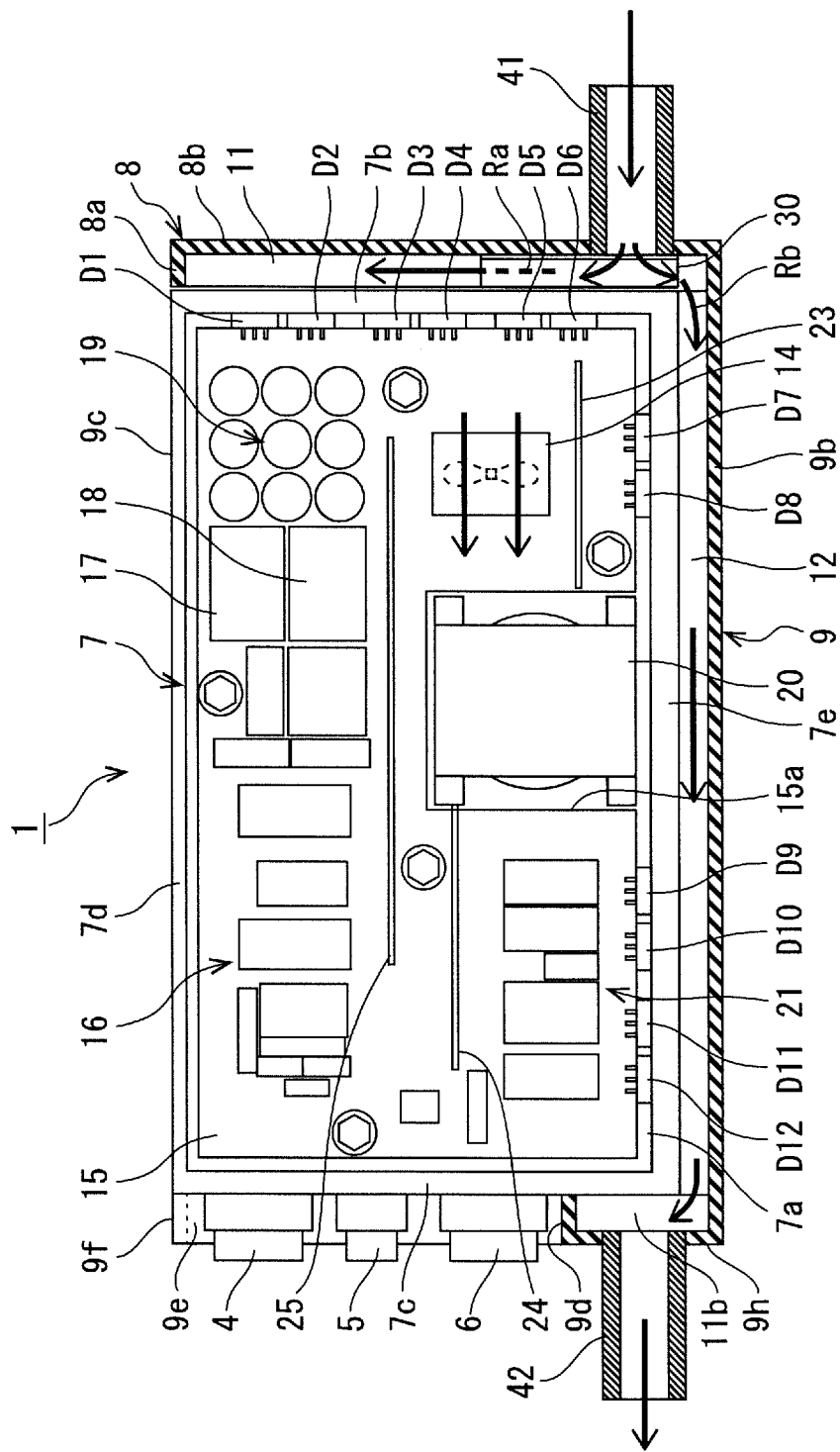
FIG. 10 is a plan view illustrating an inside of the power converter of the second embodiment with a lid removed.
Figure 11:
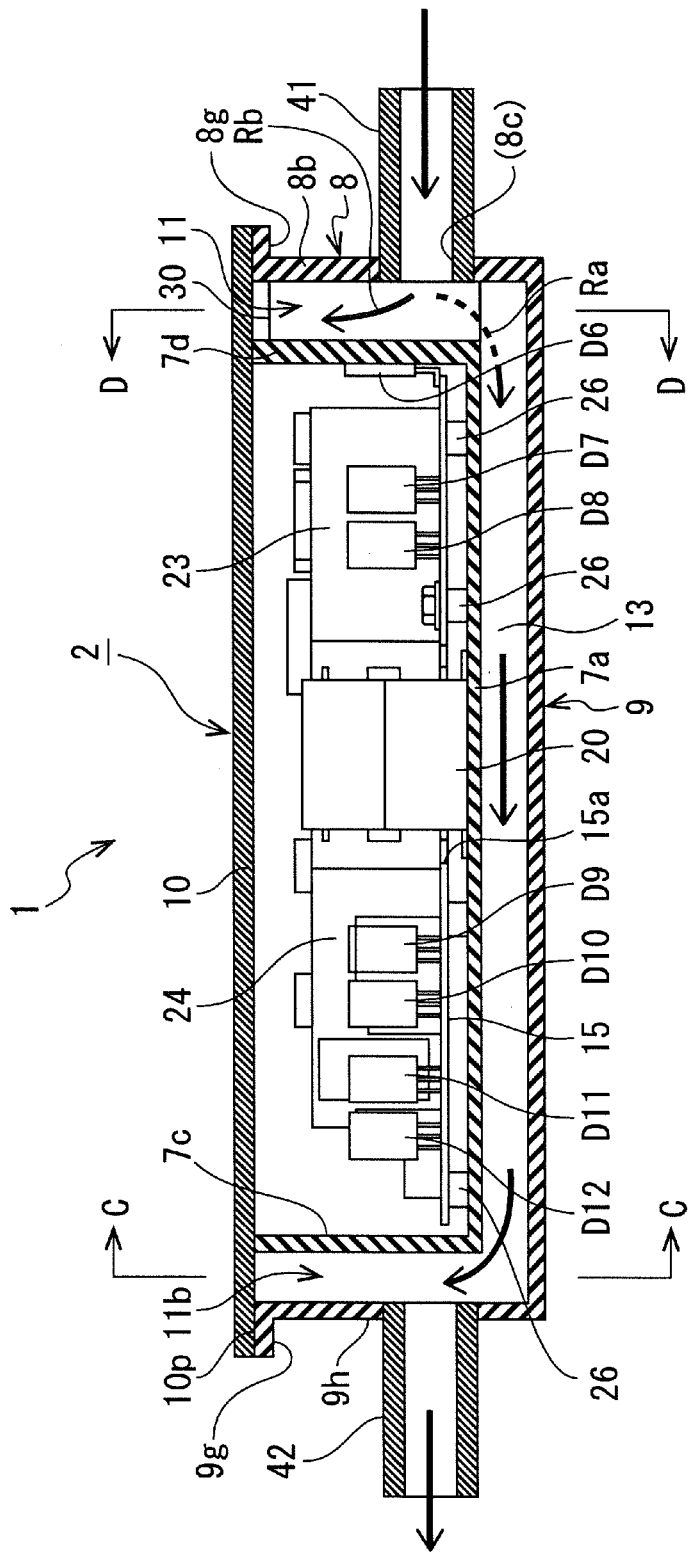
FIG. 11 is a cross-sectional view for describing a chamber of the second embodiment and illustrates the diagram corresponding to FIG. 2 of the first embodiment.

According to the power converter 1 of the second embodiment, since the flat plate-like partition portion 30 that obliquely partitions the inside of the chamber room 11 so as to distribute the cooling water from the pump 70 toward the two surfaces 7a and 7e, it is possible to distribute the cooling water introduced from the cooling water supply port 41 to the chamber room 11 toward the two surfaces 7a and 7e with the aid of the partition portion 30 as indicated by arrow Ra and Rb in FIGS. 10, 11, and 13. Due to this, it is possible to supply a desired amount of cooling water corresponding to the heat generating ratio of the respective surfaces 7a and 7e to the two adjacent and orthogonal surfaces 7a and 7e. Thus, it is possible to efficiently cool the two adjacent and orthogonal surfaces 7a and 7e of the rectangular parallelepiped housing 2.

INDUSTRIAL APPLICABILITY

As described above, according to the present invention, it is possible to provide an electronic equipment cooling device which has a rectangular parallelepiped housing in which heat-generating components are incorporated and which can cool two adjacent and orthogonal surfaces of the rectangular parallelepiped housing efficiently and a power converter having the same.

EXPLANATION OF REFERENCE NUMERALS

1 Power converter
2 Housing
3 Blower fan (Coolant supply device)
4 Input connector
5 Control connector
6 Output connector
7 Casing
7a Bottom portion (Bottom surface of housing)
7b Short-side side wall (Second side wall surface)
7c Short-side side wall
7d Long-side side wall
7e Long-side side wall (First side wall surface)
8 Chamber forming wall (Chamber portion)
8a Contacting wall
8b Facing wall
8c Opening (Coolant inlet port)
9 Casing cover (Cover portion)
9a Bottom plate
9b, 9c Side plate
10 Lid
11 Chamber room
12 Side-wall fin
13 Bottom fin
14 Inner fan
15 Base substrate
15a Notch
16 Input-side noise filter unit
17 First reactor
18 Second reactor
19 Electrolytic capacitor group
20 Transformer
21 Output-side noise filter unit
23 First circuit board
24 Second circuit board
25 Third circuit board
26 Support
27, 28 Passage
30 Partition portion
41 Cooling water supply port (Coolant inlet port)
42 Cooling water discharge port
50 Heat exchanger
60 Reservoir tank
70 Pump (Coolant supply device)
D1 to D2 Semiconductor device
Lk Imaginary slope surface

The invention claimed is:

1. An electronic equipment cooling device, comprising:
a rectangular parallelepiped housing in which at least one heat-generating component is disposed, the housing having a first side wall surface and a second side wall surface that are opposite to each other, and a bottom surface;
a heat radiating side-wall fin formed on the first side wall surface of the housing;
a heat radiating bottom fin formed on the bottom surface of the housing;
a cover portion that covers the side-wall fin and the bottom fin;
a chamber forming wall that defines a chamber room between the chamber forming wall and the second side wall surface of the housing, the chamber room being in communication with a space at an inner side of the electronic equipment cooling device, the chamber forming wall having a coolant inlet port formed therein, through which a coolant is supplied and flows through the chamber room to the space;
a coolant supply device that supplies the coolant through the coolant inlet port; and
a flat plate-like partition portion disposed in the chamber room so as to obliquely partition the chamber room to distribute the coolant from the coolant inlet port toward the first side wall surface, where the side-wall fin is formed, and the bottom surface where the bottom fin is formed, wherein
the partition portion is provided as a component independent of the housing and is detachably attached to an inside of the chamber room, and
the partition portion has a flat plate-like surface, of which an inclination angle is adjustable.

2. The electronic equipment cooling device according to claim 1, wherein the coolant is water, and the coolant supply device is a pump.

3. The electronic equipment cooling device according to claim 1, wherein the coolant is air and the coolant supply device is a blower fan.

4. The electronic equipment cooling device according to claim 3, wherein the blower fan is attached to a position located near the first side wall surface of the housing and a corner created by one set of sides that the first side wall surface and the bottom surface share, and the partition portion is disposed so that a flat plate-like surface of the partition portion extends along an imaginary slope line that intersects said corner.

5. The electronic equipment cooling device according to claim 4, wherein the coolant inlet port has a rectangular opening, and the rectangular opening is disposed so that a direction of one diagonal line of the rectangular opening extends along an inclination direction of the flat plate-like surface of the partition portion.

6. The electronic equipment cooling device according to claim 1, wherein the coolant supply device is attached to a position located near the first side wall surface of the housing and a corner formed by the cover portion, and the partition portion is disposed so that a flat plate-like surface of the partition portion extends along a line, which has a same slope as the flat plate-like surface, that intersects said corner.

7. The electronic equipment cooling device according to claim 6, wherein the coolant inlet port has a rectangular opening, and the rectangular opening is disposed so that a direction of one diagonal line of the rectangular opening extends along an inclination direction of the flat plate-like surface of the partition portion.

8. A power converter comprising:
the electronic equipment cooling device according to claim 1, wherein at least a power conversion control unit is incorporated in the housing as one of the at least one heat-generating components;
a control connector provided in the housing;
an input connector provided in the housing; and
an output connector provided in the housing,
wherein when a control signal is input to the control connector, power input to the input connector is converted from AC power to DC power by the power conversion control unit, and the DC power is output from the output connector.

9. The electronic equipment cooling device according to claim 1, wherein said space includes passages that extend along the bottom fin and the side-wall fin, so that the coolant flows into the passages to cool the first side wall surface and the bottom surface.

10. An electronic equipment cooling device, comprising:
a housing that houses at least one heat-generating component;
a heat radiating first fin formed on one wall of the housing;
a heat radiating second fin formed on another wall of the housing;
a cover portion that covers the first and second fins;
a chamber forming wall that defines a chamber room communicating with passages formed by the first and second fins;
a coolant inlet port formed in the chamber forming wall;
a coolant supply device that supplies a coolant from the coolant inlet port into the chamber room, such that the coolant flows through the chamber room into the passages formed by the first and second fins; and
a partition portion disposed in the chamber room to partition the chamber room to distribute the coolant from the coolant inlet port toward the one wall and the another wall wherein
the partition portion is provided as a component independent of the housing and is detachably attached to an inside of the chamber room, and
the partition portion has a flat plate-like surface, of which an inclination angle is adjustable.

11. The electronic equipment cooling device according to claim 10, wherein the passages extend along the first and second fins, so that the coolant flows into the passages to cool the one and another walls.

12. The electronic equipment cooling device according to claim 10, wherein the partition portion extends diagonally within the chamber room.

* * * * *